(12) United States Patent
Xu et al.

(10) Patent No.: US 9,019,707 B2
(45) Date of Patent: Apr. 28, 2015

(54) SERVER SYSTEM

(71) Applicants: Inventec (Pudong) Technology Corporation, Shanghai (CN); Inventec Corporation, Taipei (TW)

(72) Inventors: Ji-Peng Xu, Shanghai (CN); Guang-Zhao Tian, Shanghai (CN)

(73) Assignees: Inventec (Pudong) Technology Corporation, Shanghai (CN); Inventec Corporation, Taipei (TW)

( * ) Notice: Subject to any disclaimer, the term of this patent is extended or adjusted under 35 U.S.C. 154(b) by 247 days.

(21) Appl. No.: 13/748,176

(22) Filed: Jan. 23, 2013

(65) Prior Publication Data

US 2014/0085810 A1 Mar. 27, 2014

(30) Foreign Application Priority Data

Sep. 21, 2012 (CN) .......................... 2012 1 0355191

(51) Int. Cl.
*G06F 1/16* (2006.01)
*G06F 1/20* (2006.01)
*H05K 7/14* (2006.01)

(52) U.S. Cl.
CPC .. *G06F 1/16* (2013.01); *G06F 1/20* (2013.01); *H05K 7/1492* (2013.01)

(58) Field of Classification Search
CPC .......... G06F 9/5072; G06F 1/16; G06F 1/20; H01R 25/006; H01R 13/68; H01R 13/72; H05K 7/14; H05K 7/1422; H05K 7/1427; H05K 7/1485; H05K 7/1487; H05K 7/1488; H05K 7/1492; H05K 7/20136

USPC .......... 361/679.48, 724, 725, 679.01–679.02; 312/223.1–223.3

See application file for complete search history.

(56) References Cited

U.S. PATENT DOCUMENTS

| 7,791,890 | B2* | 9/2010 | Ishida | 361/727 |
|---|---|---|---|---|
| 8,743,551 | B2* | 6/2014 | Wang | 361/727 |
| 2012/0274193 | A1* | 11/2012 | Qin | 312/236 |
| 2012/0293951 | A1* | 11/2012 | Jai | 361/679.53 |
| 2013/0039001 | A1* | 2/2013 | Jau et al. | 361/679.48 |
| 2013/0039006 | A1* | 2/2013 | Li et al. | 361/679.48 |
| 2013/0067248 | A1* | 3/2013 | Wang | 713/300 |
| 2013/0179718 | A1* | 7/2013 | Jau et al. | 713/340 |

* cited by examiner

*Primary Examiner* — Anthony Haughton
*Assistant Examiner* — Yahya Ahmad
(74) *Attorney, Agent, or Firm* — Tim Tingkang Xia, Esq.; Morris, Manning & Martin, LLP

(57) ABSTRACT

A server system includes a rack, at least one server, a power supply, a network switch device and a power cable and. The rack has a front side and a rear side disposed oppositely. The rack defines an upper area, a middle area and a lower area. The middle area is disposed between the upper and the lower area. The servers are detachably disposed in the upper or the lower area. Each server having a power input port. The power supply is disposed in the middle area and adjacent to the front side. The network switch device is disposed in the middle area and stacked with the power supply. A gap is disposed between the network switch device and the power supply. The power cable penetrates through the gap to the front side. The power supply converts an external alternating current from the power cable to the server.

13 Claims, 6 Drawing Sheets

SERVER SYSTEM

CROSS-REFERENCE TO RELATED APPLICATIONS

This non-provisional application claims priority under 35 U.S.C. §119(a) on Patent Application No(s). 201210355191.4 filed in China on Sep. 21, 2012, the entire contents of which are hereby incorporated by reference.

BACKGROUND OF THE INVENTION

1. Technical Field of the Invention

The present disclosure relates to a server system, and more particularly to a rack server system.

2. Description of the Related Art

Nowadays, the information technology is under a rapid development era. Computers, such as desktop or laptop, are widely used by corporations and individuals to handle various tasks. As the communication technology becomes highly developed, transnational electronic commerce has already replaced regional business transaction. As a result, the electronization of corporations is becoming a development trend. Common personal computers can no longer meet the business requirements of corporations. Therefore, computer companies have developed specialized server systems with different functions such as cloud computing, firewall, etc., in order to solve the problems of electronization for corporations.

Take rack server system as an example, rack server system comprises a cabinet and a plurality of servers installed inside the cabinet. In other words, many servers are installed in the cabinet of rack server system at the same time. The rack server system is convenient for management so the servers can be collaborated to perform large scale computing. Therefore, the rack server system is widely used in the industry. However, besides the servers are accommodated in the space of the rack of rack server system, many electronic devices and cables are also installed inside the rack. Therefore, the rack server system is relatively large in size and the space is wasted.

SUMMARY OF THE INVENTION

A server system disclosed in an embodiment of the disclosure comprises a rack, several servers, a power supply, a network switch device and a power cable. The rack has a front side and a rear side disposed oppositely to each other. The rack defines an upper area, a middle area and a lower area. The middle area is disposed between the upper area and the lower area. The servers are detachably disposed in the upper area or the lower area inside the rack. Each server has a power input port. The power supply is disposed in the middle area inside the rack and adjacent to the front side of the rack. The network switch device is disposed in the middle area inside the rack and above the power supply. The network switch device keeps a distance from the power supply so that a gap is disposed between the network switch device and the power supply. The power cable is adapted for penetrating through the gap to the front side of the rack and is electrically connected to the power supply from a front side of the power supply. The power cable is used for transmitting an external alternating current. The power supply is used for converting the alternating current into a direct current. The power supply is electrically connected to the power input port of each server, so as to supply power to each server.

BRIEF DESCRIPTION OF THE DRAWINGS

The present disclosure will become more fully understood from the detailed description given herein below for illustration only, and thus are not limitative of the present disclosure, and wherein.

DETAILED DESCRIPTION

Figure 1A:
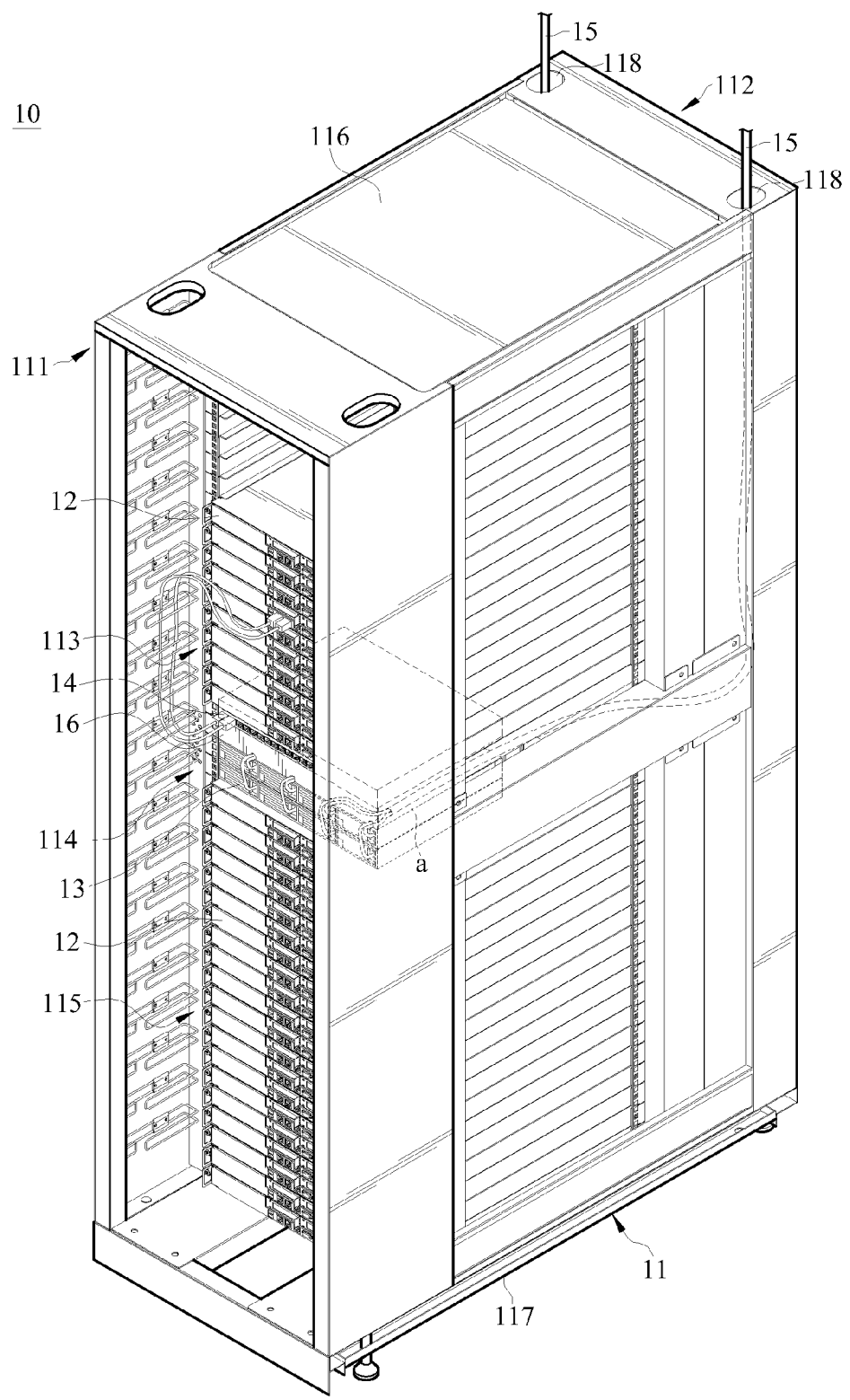
FIGS. 1A to 1C are structural illustrations of a server system according to an embodiment of the disclosure.
Figure 1B:
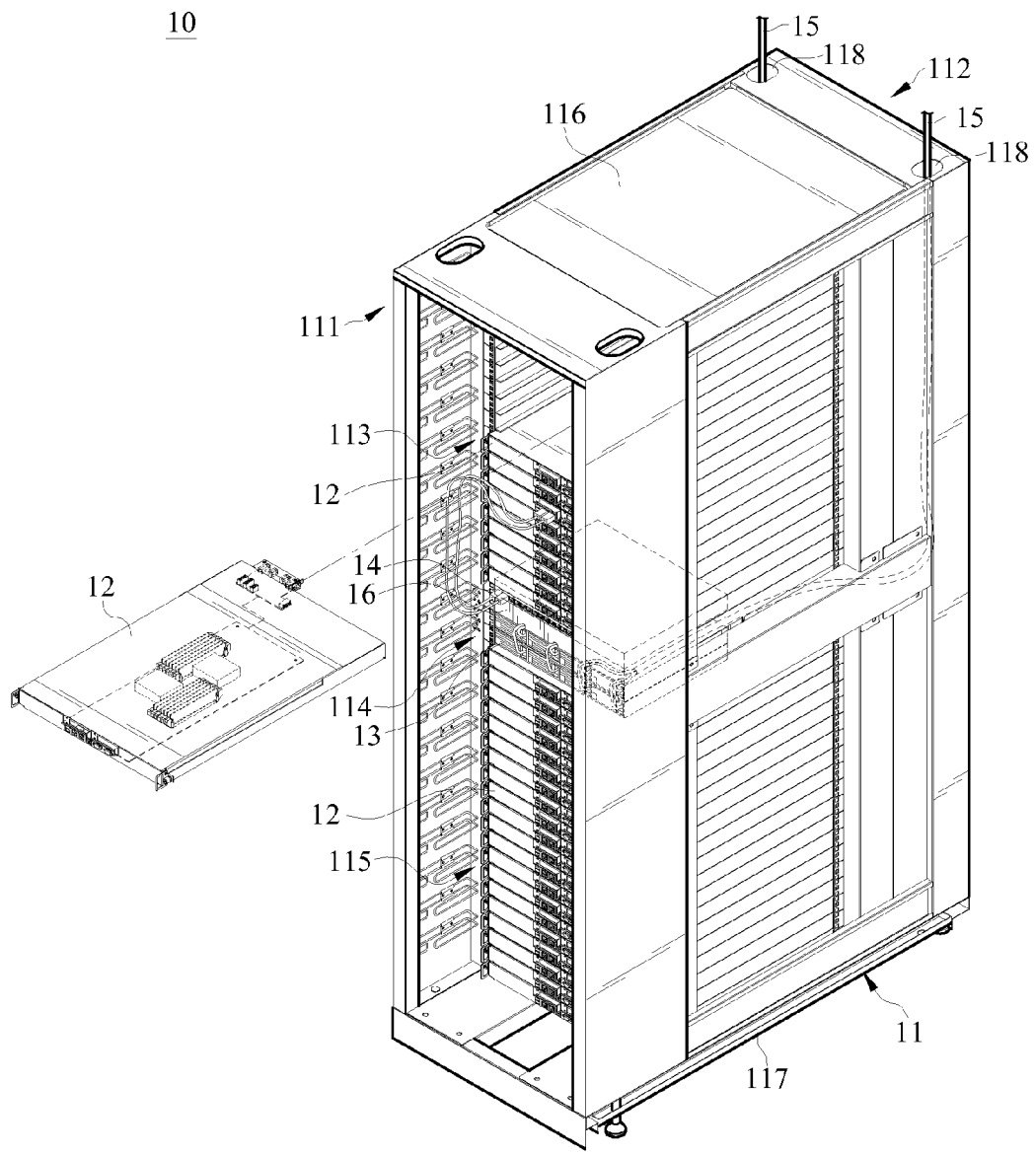
Figure 1C:
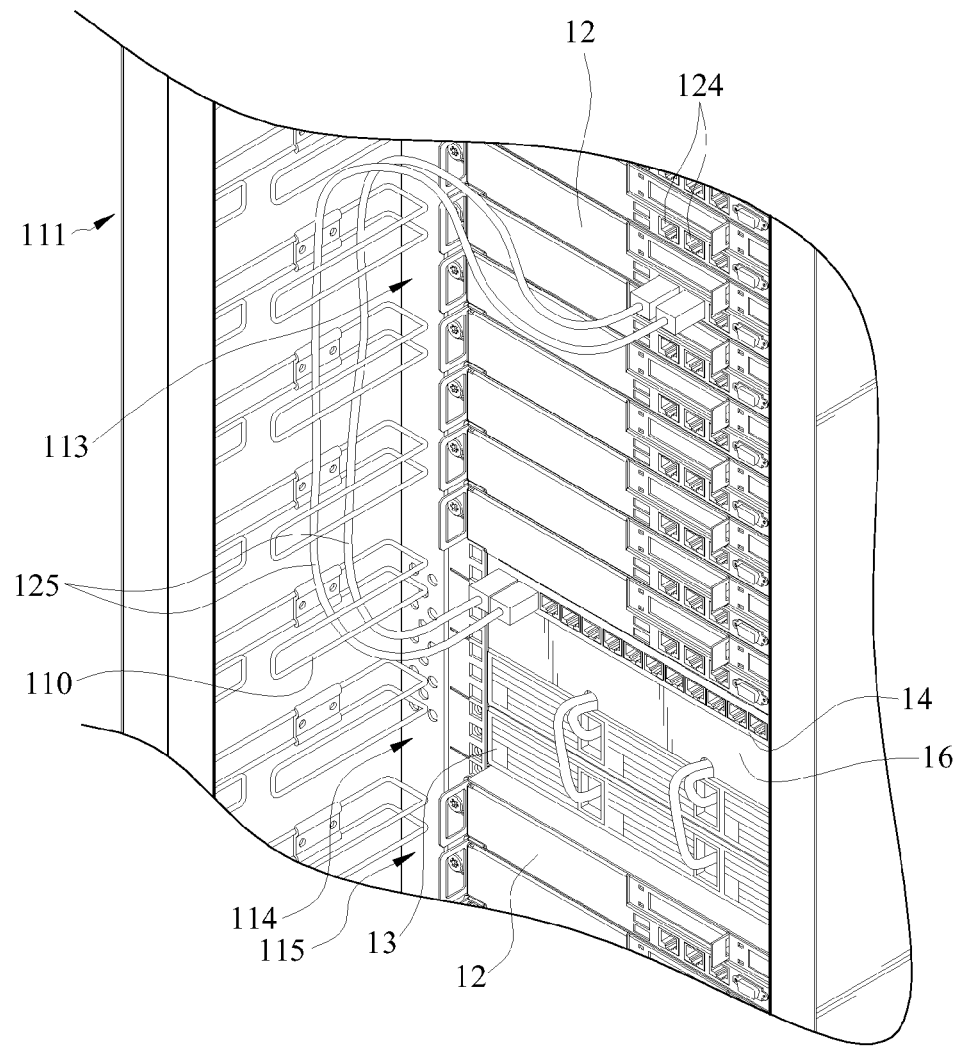

The detailed features and advantages of the disclosure are described below in great detail through the following embodiments, the content of the detailed description is sufficient for those skilled in the art to understand the technical content of the present disclosure and to implement the disclosure there accordingly. Based upon the content of the specification, the claims, and the drawings, those skilled in the art can easily understand the relevant objectives and advantages of the disclosure.

The directions above, below, left and right mentioned in the embodiments of the present disclosure are used to explain the relative positions between a specific element and another element in the drawings, rather than used to limit the absolute positions between the specific element and the other element. For instance, in an embodiment, an object A is disposed above an object B; in another embodiment, the object A can be disposed below the object B. Furthermore, when it is mentioned that the object A is disposed above the object B, it indicates the relative positions between the object A and the object B, rather than limiting the object A is disposed directly above the object B. In other words, in other embodiments, another object C can be disposed between the object A and the object B.

Figure 2:
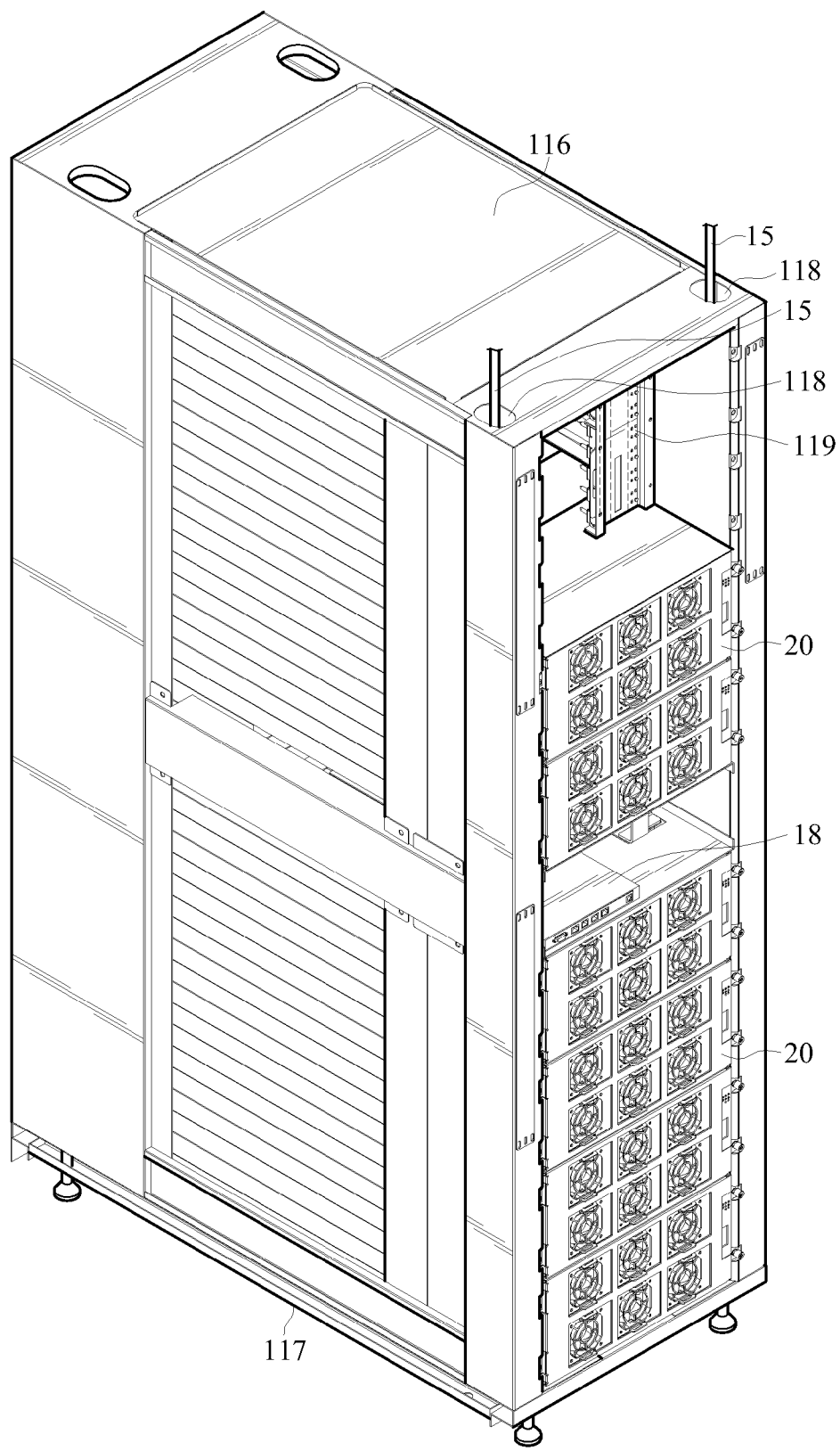
FIG. 2 is a perspective view of the server system in FIG. 1A viewed from another viewing angle.
Figure 3:
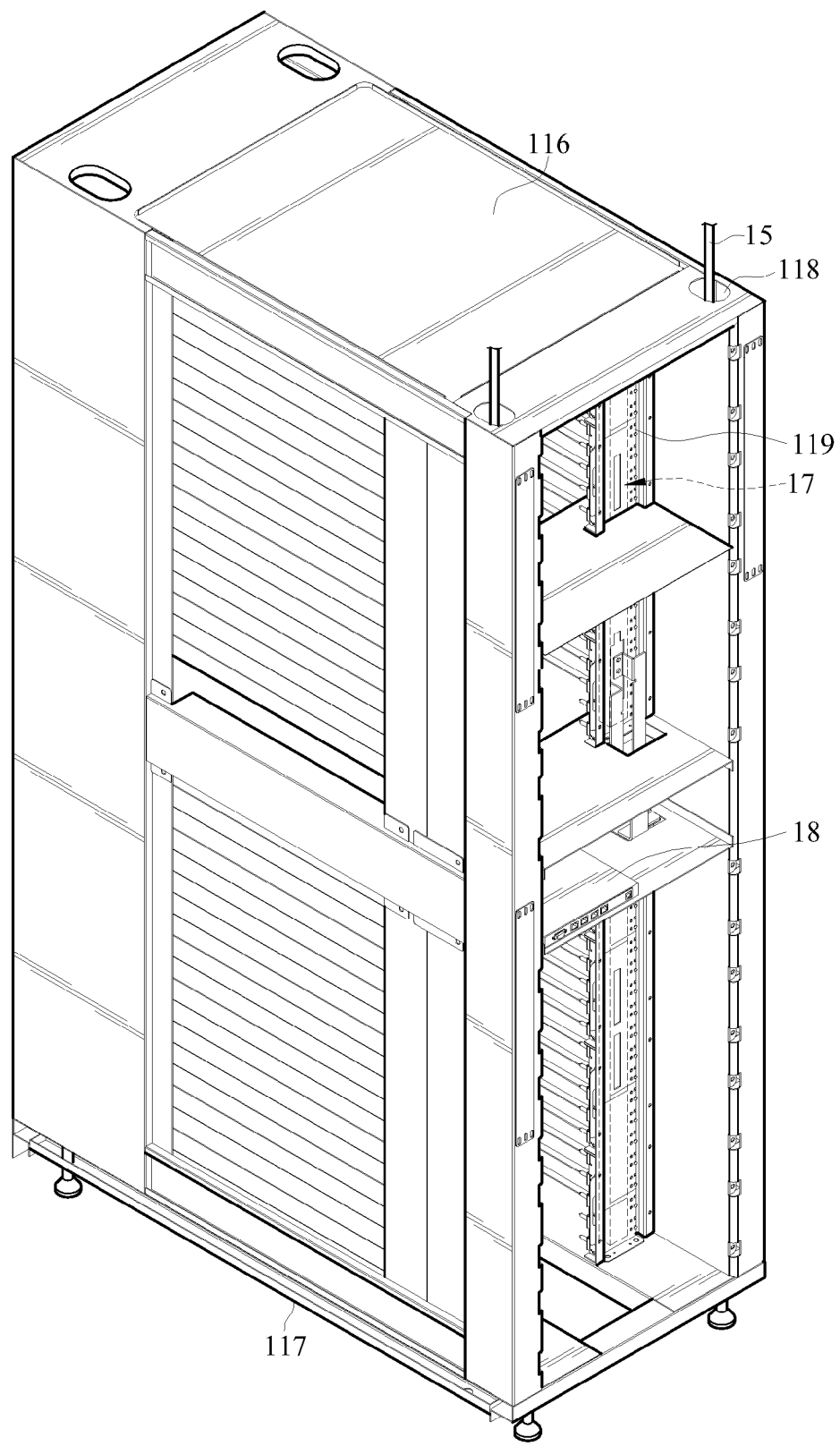
FIG. 3 is a perspective view of the server system in FIG. 2 with a fan module disassembled.
Figure 4:
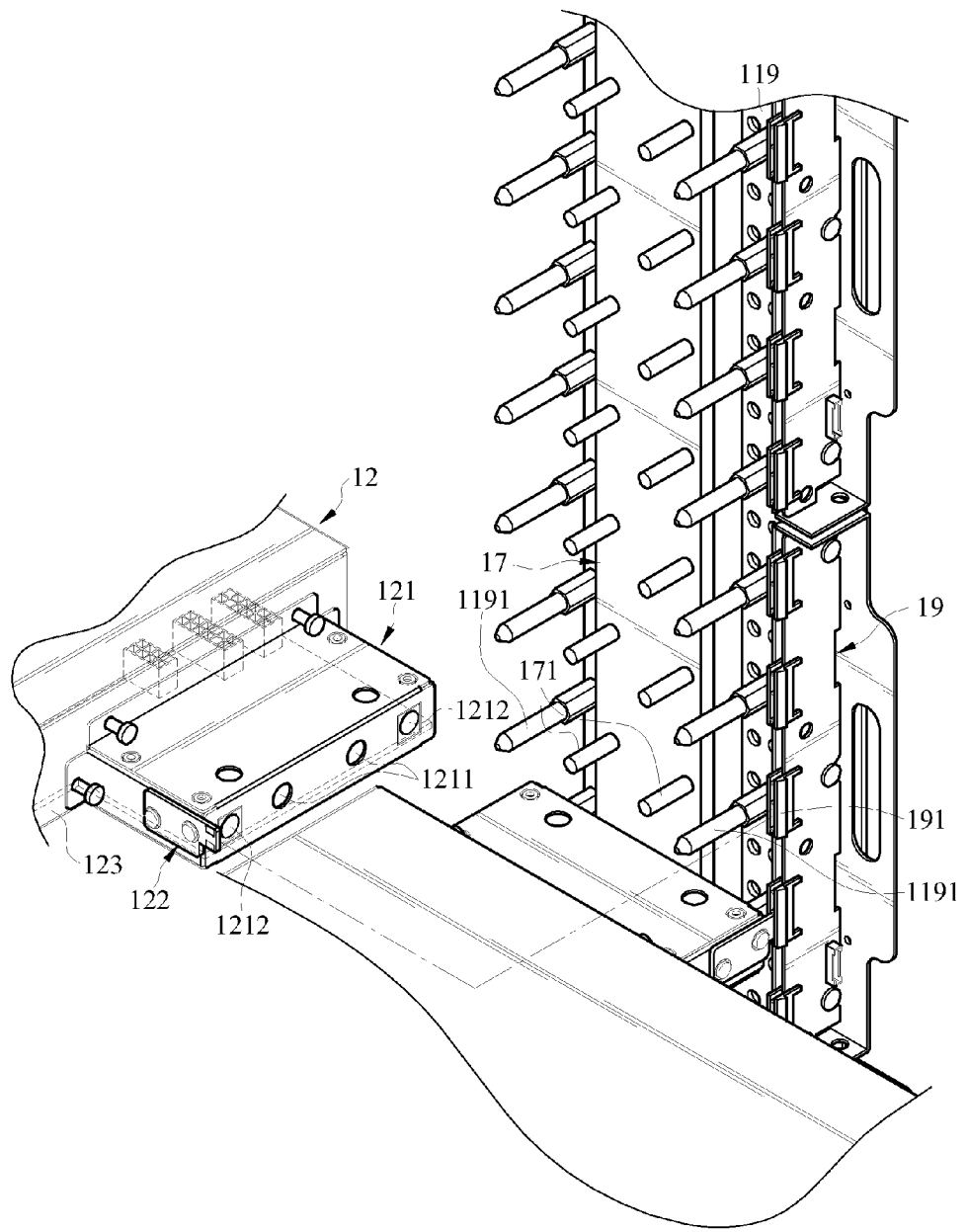
FIG. 4 is a partial enlarged exploded view of the server system in FIG. 1A.

Please refer to FIGS. 1A to 4. FIGS. 1A to 1C are structural illustrations of a server system according to an embodiment of the disclosure; FIG. 2 is a perspective view of the server system in FIG. 1A viewed from another angle; FIG. 3 is a perspective view of the server system in FIG. 2 with a fan module dismounted; and FIG. 4 is a partial enlarged exploded view of the server system in FIG. 1A.

A rack server system is used as an example for a server system 10 of this embodiment. The server system 10 comprises a rack 11, several servers 12, a power supply 13, a network switch device 14, two power cables 15 and an electrically connecting module 17. It should be noted that the number of the servers 12 and the power cables 15 does not limit to the present disclosure. The number of the servers 12 just needs to be more than one.

The rack 11 has a front side 111 and a rear side 112 disposed oppositely to each other. The rack 11 defines an upper area 113, a middle area 114 and a lower area 115. The middle area 114 is disposed between the upper area 113 and the lower area 115. Furthermore, the rack 11 has a top wall at a top side 116 thereof and a bottom wall at a bottom side 117 thereof. The top wall at the top side 116 has two perforations 118 disposed at the rear side 112 of the rack 11. The power cable 15 penetrates through the perforation 118 to enter the rack 11. It should be noted that the number of the perforations 118 does not limit to the present disclosure.

The servers 12 may be detachably disposed in the upper area 113 and the lower area 115 inside the rack 11. Each server 12 may be inserted into the rack 11 from the front side 111 of the rack 11.

The power supply 13 is disposed in the middle area 114 of the rack 11 and is adjacent to the front side 111 of the rack 11. The power supply 13 is used for providing a direct current to each of the servers 12.

The network switch device 14 is disposed in the middle area 114 inside the rack 11. The network switch device 14 is disposed adjacent to the front side 111 of the rack 11 and stacked with the power supply 13. The network switch device 14 keeps a distance from the power supply 13 such that a gap (a) is formed between the network switch device 14 and the power supply 13. The network switch device 14 may be above or below the power supply 13. In this embodiment, the network switch device 14 is stacked above the power supply 13. A plurality of cable arranging structures 110 are disposed at the front side 111 of the rack 11. A plurality of network jacks are disposed in the front side of the network switch device 14. The network jack of the network switch device 14 is connected to a network socket 124 of the server 12 through a cable 125 arranged by at least one of the cable arranging structures 110, so that the network switch device 14 may communicate with the server 12. Because the network switch device 14 is stacked with the power supply 13 instead of being arranged side by side with the power supply 13, the size of the rack 11 may be reduced effectively.

The two power cables 15 penetrate into the rack 11 from the rear side 112 of the rack 11 through the perforations 118 in the top wall of the rack 11. The two power cables 15 penetrate through the gap (a) between the network switch device 14 to the front side 111 of the rack 11 and are electrically connected to the power supply 13 from a front side of the power supply 13. It should be noted that because the servers 12 are placed inside the rack 11 from the front side 111 of the rack 11, the design of having the power cables 15 electrically connecting to the power supply 13 from the front side 111 of the rack 11 may enhance the convenience of assembling the server system 10. The power cables 15 are used for receiving an alternating current externally and for transmitting the alternating current to the power supply 13. The power supply 13 converts the alternating current into a direct current and provides the direct current for the servers 12. As for the way of supplying electricity to the servers 12 by the power supply 13, it will be described afterwards.

Moreover, the server system 10 further comprises a fan module 20 disposed at the rear side 112 of the rack 11. The fan module 20 is used for dissipating heat of the heating elements (such as the servers 12, the power supply 13, etc.) inside the server system 10.

In this embodiment or other embodiments, the server system 10 further comprises a blocking piece 16 disposed at the front side of the gap (a) and covering the gap (a). The power cable 15 penetrates through the blocking piece 16. In this embodiment, an airstream, generated by a fan built in the power supply 13, flows from the front side 111 of the rack 11 towards the rear side 112 of the rack 11. Therefore, because of covering the front side of the gap (a) by the blocking piece 16, the airstream, generated by the fan built in the power supply 13, will not be discharged from the front side 111 of the rack 11 through the gap (a) in order to avoid turbulent airstream from affecting the heat dissipation.

Please refer to FIGS. 3 and 4. In this embodiment, each of the servers 12 comprises a shell 123, a baseboard management controller (BMC, not shown), a power input port 121 and a signal connector 122. The power supply 13 is electrically connected to the power input port 121 of each server 12, so as to supply power to each server 12. The power input port 121 is disposed on and protruded from a rear side of the shell 123. The power input port 121 further comprises two power sockets 1211 and two positioning holes 1212. The two power sockets 1211 and the two positioning holes 1212 are arranged alternately side by side to each other. The two power sockets 1211 are disposed between the two positioning holes 1212. The signal connector 122 is disposed adjacent to the power input port 121. Typically, the signal connector 122 is fixed on a side of the power input port 121.

Furthermore, a supporting frame 119 is further disposed at the rear side 112 of the rack 11. The supporting frame 119 extends from the bottom side 117 of the rack 11 towards the top side 116 of the rack 11. The electrically connecting module 17 is disposed on the supporting frame 119, and the electrically connecting module 17 extends from the bottom side 117 of the rack 11 towards the top side 116 of the rack 11. The electrically connecting module 17 is electrically connected to the power supply 13 and is disposed at the rear side 112 of the rack 11. At least two conductive pins 171 are further protruded from the surface of the electrically connecting module 17. In this embodiment, the electrically connecting module 17 has a plurality of the conductive pins 171 grouped in pairs and arranged side by side to each other. Every two of the conductive pins 171 correspond to the one server 12. Each group of the conductive pins 171 (comprises two of the conductive pins 171) corresponds to the two power sockets 1211 of each of the servers 12.

Furthermore, the supporting frame 119 of the rack 11 may further comprise at least one guiding pin 1191. In this embodiment, the guiding pins 1191 are grouped in pairs and arranged side by side to each other. Each set of the guiding pins 1191 (comprises two of the guiding pins 1191) corresponds to the two positioning holes 1212 of each of the servers 12. Furthermore, the guiding pins 1191 are disposed adjacent to the conductive pins 171. Every two of the conductive pins 171 corresponding to a server 12 are disposed between their two corresponding guiding pins 1191, and are inserted into the two power sockets 1211 of their corresponding server 12 that the power input port 121 is electrically connected to the electrically connecting module 17.

Furthermore, the server system 10 may further comprise a signal connection base 19 and a rack management controller (RMC) 18. The signal connection base 19 is disposed on the supporting frame 119 of the rack 11. The signal connection base 19 has a plurality of signal ports 191. Each of the signal ports 191 corresponds to one of the servers 12, respectively. The rack management controller 18 is disposed in the middle area 114 of the rack 11. The rack management controller 18 is disposed adjacent to the rear side 112 of the rack 11. The rack management controller 18 is electrically connected to the signal connection base 19. The position of the signal port 191 is about that the signal port 191 is in which row of the rack 11. The position of each of the signal ports 191 is determined in the rack 11. Each of the signal ports 191 is corresponding to an area for the one server 12 to position. When the signal connector 122 is electrically connected to the signal port 191, the rack management controller 18 communicates with the server 12 through the signal connector 122 and the signal port 191, and determines the position of the server 12 inside the rack 11 according to the position of the signal port 191 through which communication data passes. The position of the server 12 is about that the server 12 is in which row of the rack 11.

Each of the signal ports 191 connects with a signal connector of its corresponding server 12. With one of the servers 12 removed from the rack 11, the power input port 121 and the signal connector 122, both of the same server 12, are separated from the electrically connecting module 17 and the signal port 191 which is corresponding to the server 12, respectively, and with one of the servers 12 installed into the rack 11, the power input port 121 and the signal connector 122, both of the same server 12, joint with the electrically connecting module 17 and the signal port which is corresponding to the server 12, respectively. The rack management controller 18 communicates with the server 12 via the signal connector 122 of the server 12 and the signal port 191 which is corresponding to the server 12, and determines the position of the server 12 inside the rack 11 according to the position of the signal port 191 which is electrically connected to the server 12.

Therefore, when each of the servers 12 is installed inside the rack 11, each set (comprising two of the guiding pins 1191) of the guiding pins 1191 is used for insertion into the two positioning holes 1212 of the power input port 121 of each of the servers 12. Therefore, when installing each of the servers 12 into the rack 11, guiding and positioning effects may be provided. Each set (comprising two of the conductive pins 171) of the conductive pins 171 is inserted into the two power sockets 1211 of the power input port 121 of each of the servers 12, such that the power input port 121 is electrically connected to the electrically connecting module 17.

Furthermore, when the conductive pins 171 are inserted into the power sockets 1211, the signal connector 122 of each of the servers 12 is inserted into the corresponding signal port 191 in order to electrically connect each of the servers 12 to the rack management controller 18. The rack management controller 18 determines whether the power input port 121 is electrically connected to the electrically connecting module 17 and makes the power supply 13 provide power when the electrical connection between the power input port 121 and the electrically connecting module 17 is obtained. Therefore, the power supply 13 may transmit the direct current to each of the servers 12 through the electrically connecting module 17, and all of the servers 12 may be supplied by the power of the power supply 13. Thereby, a built-in power supply module is not required in each of the servers 12 in order to save the cost for the servers 12 and reduce the size of the servers 12.

In addition, the rack management controller 18 communicates with the server 12 via the signal port 191 which is corresponding to the server 12 and the signal connector 122 of the server 12, and determines the row position of the server 12 in the upper area 113 or the lower area 115 inside the rack 11 according to the position of the signal port 191 through which communication data passes. Therefore, each of the servers 12 may be controlled and managed conveniently.

According to the server system disclosed in the above embodiment, by stacking the network switch device with the power supply instead of side by side with each other, the size of the rack can be reduced effectively. Furthermore, because the power supply provides power for each of the servers, built-in power supply module is not required inside each of the servers in order to save the cost for the servers and reduce the size of the servers and the overall size of the server system.

The foregoing description of the exemplary embodiments of the invention has been presented only for the purposes of illustration and description and is not intended to be exhaustive or to limit the invention to the precise forms disclosed. Many modifications and variations are possible in light of the above teaching.

The embodiments were chosen and described in order to explain the principles of the invention and their practical application so as to activate others skilled in the art to utilize the invention and various embodiments and with various modifications as are suited to the particular use contemplated. Alternative embodiments will become apparent to those skilled in the art to which the present invention pertains without departing from its spirit and scope. Accordingly, the scope of the present invention is defined by the appended claims rather than the foregoing description and the exemplary embodiments described therein.

What is claimed is:

1. A server system, comprising:
    a rack having a front side and a rear side disposed oppositely to each other, wherein the rack defines an upper area, a middle area and a lower area, and the middle area is disposed between the upper area and the lower area;
    several servers detachably disposed in the upper area or the lower area inside the rack, and each server having a power input port;
    a power supply disposed in the middle area inside the rack and adjacent to the front side of the rack;
    a network switch device disposed in the middle area inside the rack and stacked with the power supply, wherein the network switch device is kept a distance from the power supply so that a gap is disposed between the network switch device and the power supply;
    a power cable penetrating through the gap to the front side of the rack and being electrically connected to the power supply from a front side of the power supply;
    a signal connection base being disposed at the rear side of the rack, the signal connection base being electrically connected to the several servers, the signal connection base having an upper section, a middle section and a lower section, the upper section corresponding to the upper area, the middle section corresponding to the middle area, and the lower section corresponding to the lower area; and
    a rack management controller being disposed in the middle area of the rack and adjacent to the rear side of the rack, the rack management controller being electrically connected to each server and the middle section of the signal connection base, wherein the power cable is used for transmitting an external alternating current, and the power supply is used for converting the alternating current into a direct current, and wherein the power supply is electrically connected to the power input port of each server, so as to supply power to each server.

2. The server system as claimed in claim 1, further comprising a blocking piece disposed at the front side of the rack and covering the gap, wherein the power cable penetrates through blocking piece.

3. The server system as claimed in claim 1, wherein the rack comprises several cable arranging structures disposed at the front side of the rack, and the network switch device is connected to a network socket of each server through a cable arranged by at least one of the several cable arranging structures.

4. The server system as claimed in claim 1, wherein an electrically connecting module is disposed at the rear side of the rack, the electrically connecting module being electrically connected to the power supply, the signal connection base having a plurality of signal ports, wherein each signal port is corresponding to one of the several servers, and the one of the several servers further comprises a signal connector connecting with the one of the signal ports, and wherein with the one of the several servers removed from the rack, the power input port and the signal connector both of the one of the several servers are separated from the electrically connecting module and the one of the signal ports, respectively, and with the one of the several servers installed into the rack, the power input port and the signal connector both of the one of the several servers joint with the electrically connecting module and the one of the signal ports, respectively.

5. The server system as claimed in claim 4, wherein the rack management controller communicates with the one of the several servers via the signal connector of the one of the several servers and the one of the signal ports, and determines the position of the one of the several servers inside the rack according to the position of the one of the signal ports which is electrically connected to the one of the several servers.

6. The server system as claimed in claim 1, further comprising an electrically connecting module disposed at the rear side of the rack and electrically connected to the power supply, wherein the power input port of each server comprises two power sockets, and the electrically connecting module includes two conductive pins protruding from a surface thereof, and wherein the two conductive pins are corresponding to one of the several servers and inserted into the two power sockets of the power input port of the one of the several servers, respectively, such that the power input port is electrically connected to the electrically connecting module.

7. The server system as claimed in claim 6, wherein the power input port of each server further comprises at least one positioning hole, and the rack further comprises at least one guiding pin adjacent to the electrically connecting module and used for insertion into the at least one positioning hole of the one of the several servers.

8. The server system as claimed in claim 6, wherein the signal connection base has a plurality of signal ports, and the one of the several servers further comprising a signal connector inserted into one of the signal ports.

9. The server system as claimed in claim 8, wherein the signal connector and the power input port both of the same server are disposed adjacent to each other.

10. The server system as claimed in claim 8, wherein the rack management controller communicates with the one of the several servers via the signal connector of the one of the several servers and the one of the signal ports, and determines the position of the one of the several servers inside the rack according to the position of the one of the signal ports which is electrically connected to the one of the several servers.

11. The server system as claimed in claim 1, further comprising a fan module disposed at the rear side of the rack.

12. The server system as claimed in claim 1, wherein the rack has a top wall, and wherein the top wall has a perforation disposed at the rear side of the rack, and wherein the power cable penetrates through the perforation to enter the rack.

13. The server system as claimed in claim 1, wherein the network switch device is stacked above the power supply.

\* \* \* \* \*